United States Patent
Gardener et al.

[11] Patent Number: 6,127,251
[45] Date of Patent: Oct. 3, 2000

[54] SEMICONDUCTOR DEVICE WITH A REDUCED WIDTH GATE DIELECTRIC AND METHOD OF MAKING SAME

[75] Inventors: Mark I. Gardener, Cedar Creek; Frederick N. Hause; Charles E. May, both of Austin, all of Tex.

[73] Assignee: Advanced Micro Devices, Inc., Austin, Tex.

[21] Appl. No.: 09/149,398

[22] Filed: Sep. 8, 1998

[51] Int. Cl.[7] .................. H01L 21/3205; H01L 21/4763
[52] U.S. Cl. .................. 438/585; 438/591; 438/619; 438/287; 257/410; 257/411
[58] Field of Search .................. 257/410, 411; 458/287, 591, 595, 756, 757

[56] References Cited

U.S. PATENT DOCUMENTS

| 5,717,222 | 2/1998 | Nakamura et al. | 257/38 |
| 5,766,998 | 6/1998 | Tseng | 438/291 |
| 5,864,160 | 1/1999 | Buynoski | 257/339 |
| 5,900,668 | 5/1999 | Wollesen | 257/522 |

OTHER PUBLICATIONS

J. L. Vossen and W Kern, eds. Thin Film Processes, Academic Press: New York, pp. 413–424, 1978.
S. Wolf, Silicon Processing for the VSLI Era, vol. 2: Process Integration, pp. 435–436, 1990.
H. S. Momose, et al. "High–frequency AC characteristics of 1.5 nm gate oxide MOSFETs" Electron Devices Meeting, IEEE, pp. 105–108, Dec. 1996.

Primary Examiner—Charles Bowers
Assistant Examiner—Erik J Kielin
Attorney, Agent, or Firm—Williams, Morgan & Amerson, P.C.

[57] ABSTRACT

The present invention is directed to a semiconductor device having a reduced feature size and a method of making same. The device is comprised of a gate dielectric positioned above a semiconducting substrate, and a gate conductor positioned above said gate dielectric. The width of the gate dielectric being less than the width of the gate conductor. The device further comprises a plurality of sidewall spacers adjacent said conductor. The method is comprised of forming a gate dielectric above the surface of a semiconducting substrate, forming a gate conductor above the gate dielectric, and wet etching the gate dielectric to a finished width that is less than the width of the gate conductor.

24 Claims, 3 Drawing Sheets

SEMICONDUCTOR DEVICE WITH A REDUCED WIDTH GATE DIELECTRIC AND METHOD OF MAKING SAME

BACKGROUND OF THE INVENTION

1. Field of the Invention

The present invention is generally directed to the field of semiconductor processing, and, more particularly, to a semiconductor device with a gate dielectric having a width less than the width of the gate conductor, and method of making same.

2. Description of the Related Art

There is a constant drive within the semiconductor industry to increase the operating speed of integrated circuit devices, e.g., microprocessors, memory devices, etc. This drive is fueled by consumer demands for computers and electronic devices that operate at increasingly greater speeds. The speed at which integrated circuit devices, e.g., transistors, operate may be determined, in part, by the channel length of the transistor device. All other things being equal, the smaller the channel length of the transistor, the faster the transistor will operate. Thus, there is a constant drive to reduce the channel length on transistors to increase the overall speed of the transistor, as well as integrated circuit devices incorporating such transistors.

The ability to reduce the channel length, or feature size, of modem transistors is presently limited by modem photolithography equipment and techniques. Traditionally, components of a transistor, such as the gate conductor and gate dielectric, are made by forming the appropriate process layers above the surface of a semiconducting substrate, forming a layer of photoresist above the uppermost layer, developing and patterning the layer of photoresist to define a mask, and removing the portion of the process layer(s) that extend beyond the mask through one or more etching steps.

Using the traditional photolithography techniques described above, the feature size, e.g., the width of the gate conductor and gate dielectric, are directly formed in the layer of photoresist, or other similar masking layer, above the semiconducting substrate. In order to achieve further reduction in the feature size of transistors, e.g., the channel length, it is necessary to develop an alternative method that will allow formation of transistors with feature sizes smaller than that achievable with current photolithography techniques.

The present invention is directed to a semiconductor device that minimizes or reduces some or all of the aforementioned problems and a method of making same.

SUMMARY OF THE INVENTION

The present invention is directed to a semiconductor device having a reduced width gate dielectric, and a method for making same. In one embodiment, the method comprises forming a first process layer comprised of a gate dielectric material above a substrate, forming a second process layer comprised of a gate conductor material above the first process layer, and patterning the first and second process layers to define a gate dielectric and a gate conductor, said gate conductor having a width. The method continues with the performance of a wet etching process on the gate dielectric, the gate dielectric having a thickness after the etching process that is less than the width of the gate conductor.

The present invention is also directed to a new semiconductor device. The device has a gate dielectric comprised of at least one process layer and a gate conductor positioned above the at least one process layer. The width of the gate dielectric is less than the width of the gate conductor.

BRIEF DESCRIPTION OF THE DRAWINGS

The invention may be understood by reference to the following description taken in conjunction with the accompanying drawings, in which like reference numerals identify like elements, and in which.

Figure 1:
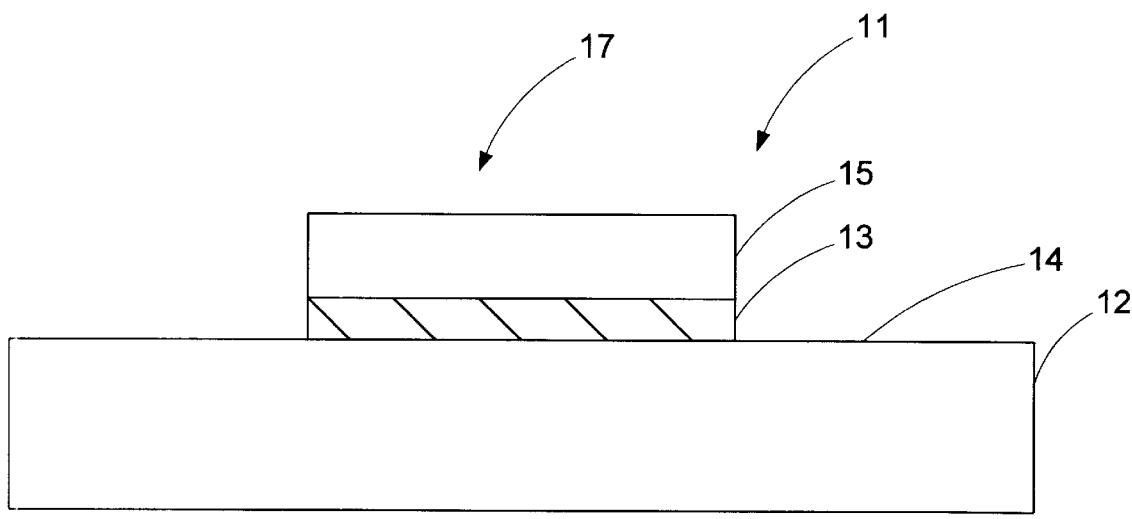
FIG. 1 is a cross-sectional view of a partially-formed semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–6. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed to a semiconductor device, e.g., a transistor, having a reduced feature size, and a method for making same. In one illustrative embodiment, the semiconductor device, e.g., transistor, has a gate dielectric that has a width less than the width of the gate conductor. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

As shown in FIG. 1, a partially-formed transistor 11 is positioned above a surface 14 of a semiconducting substrate 12. The transistor 11 is comprised of a gate dielectric 13 and a gate conductor 15, which may be collectively referred to as a stack 17. Note that, at this point in the fabrication process, the width of the gate dielectric 13 is approximately the same as the width of the gate conductor 15. In general, to create the stack 17, a process layer comprised of the gate dielectric material is formed above the surface 14 of the substrate 12, and a process layer comprised of the gate conductor material is formed above the gate dielectric layer. Thereafter, the layers are patterned to result in the stack 17 comprised of the gate conductor 15 and the gate dielectric 13, as depicted in FIG. 1. As is well known to those skilled in the art, this patterning may be accomplished by application of, for example, a layer of photoresist (not shown) above the gate conductor layer, development of the layer of photoresist, and one or more etching steps.

The gate dielectric 13 may be comprised of a variety of materials, such as silicon dioxide, oxynitride, any nitrogen bearing oxide, etc. The gate dielectric 13 may have a thickness ranging from approximately 20–30 Å and may be formed by a variety of techniques, such as thermal growing, deposition, etc. In one illustrative embodiment, the gate dielectric 13 is comprised of thermally grown silicon dioxide having a thickness ranging from approximately 20–30 Å. The gate dielectric 13 comprised of silicon dioxide may be grown at approximately 800–1000° C. in a tube furnace (for 1–5 minutes) or using a rapid thermal anneal process (for 10–60 seconds) in the presence of oxygen. Thereafter, the thermally grown layer 13 of silicon dioxide may be subjected to a dilute acid etching process to reduce the thickness of the layer to approximately 5–15 Å. In one example, this dilute acid etch may be comprised of a 100:1 concentration of hydrochloric acid.

The next process involves formation of the gate conductor 15. The gate conductor 15 may be formed of a variety of materials, such as polysilicon or a metal, such as aluminum, tantalum or titanium. Moreover, the gate conductor 15 may be formed by a variety of techniques, such as CVD, LPCVD, etc. In one illustrative embodiment, the gate conductor 15 is formed by chemical vapor deposition of polysilicon having a thickness ranging from approximately 700–2000 Å.

The next process involves subjecting the stack 17 to an etching process. The purpose of this etching process is to reduce the width of the gate dielectric 13. The etching process may be either a wet or dry etching process. For example, the stack 17 may be subjected to a 10:1–100:1 hydrochloric acid wet etching process. This wet etching process will result in the structure depicted in FIG. 2. As shown therein, the width of the gate dielectric 13, as defined by the edges 19, is less than the width of the gate conductor 15, as defined by edges 21. Using the present technique, the reduction in the thickness of the gate dielectric 13 can be accurately controlled, and may be reduced as much as is desired or warranted by the particular application. Typically, the width of the gate dielectric 13 may be reduced to approximately 60–80% of the width of the gate conductor 15.

Figure 2:
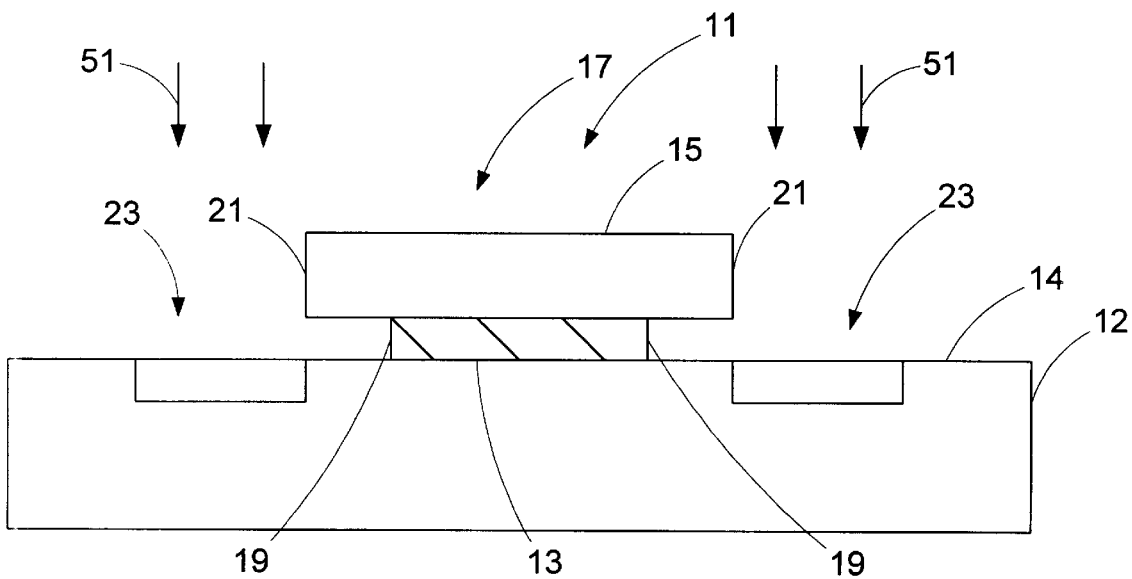
FIG. 2 is a cross-sectional view of a partially-formed semiconductor device having a reduced width gate dielectric in accordance with one embodiment of the present invention.

The next process involves implantation of a dopant material into regions 23 in the substrate 12, as depicted in FIG. 2 by the arrows 51. This process is typically accomplished by an ion implantation process at, for example, an energy level of approximately 0.8–8.0 keV and a concentration ranging from $5 \times 10^{15} - 3 \times 10^{16}$ ions/cm$^2$. Of course, the dopant may vary depending upon the particular technology. For example, for NMOS technology, arsenic could be the dopant material, whereas for PMOS technology, boron would be an appropriate dopant material. After the dopant material is implanted into the regions 23, the substrate is subjected to a rapid thermal anneal process at a temperature ranging from approximately 850–1075° C. for approximately 10–120 seconds in the presence of a dopant material, such as, for NMOS technology, arsine.

Eventually, the dopant material implanted into the regions 23, as depicted in FIG. 2, will migrate, such that the regions 23 are approximately aligned with the edges 19 of the gate dielectric 13. This objective can be accomplished in a variety of ways. For example, if the dopant material is implanted at a 0° implant angle, as indicated by the arrows 51 in FIG. 2, then the substrate 12 will be subjected to a rapid thermal anneal process at a temperature towards the upper end of the temperature range specified above, e.g., 1000° C., and held at that temperature for a time that is at the upper end of the time range specified above, e.g., 120 seconds. An alternative technique would be to perform an angled implant of the dopant material at an angle of approximately 45° using known techniques. If an angled implant technique is employed, then the heat treatment would be at the lower end of the temperature range specified above, and for a shorter period of time, e.g., 900° C. for approximately 20 seconds. Either of these alternative techniques can be used to result in the structure of the regions 23 depicted in FIG. 3. Note that, since the migration of the dopant material is isotropic, the width and depth of the regions 23 tends to increase during the heat treating process. Moreover, there is a natural gradient in the concentration of the dopant material in the portion of the regions 23 adjacent the gate dielectric 13 due to this heat treatment.

Figure 3:
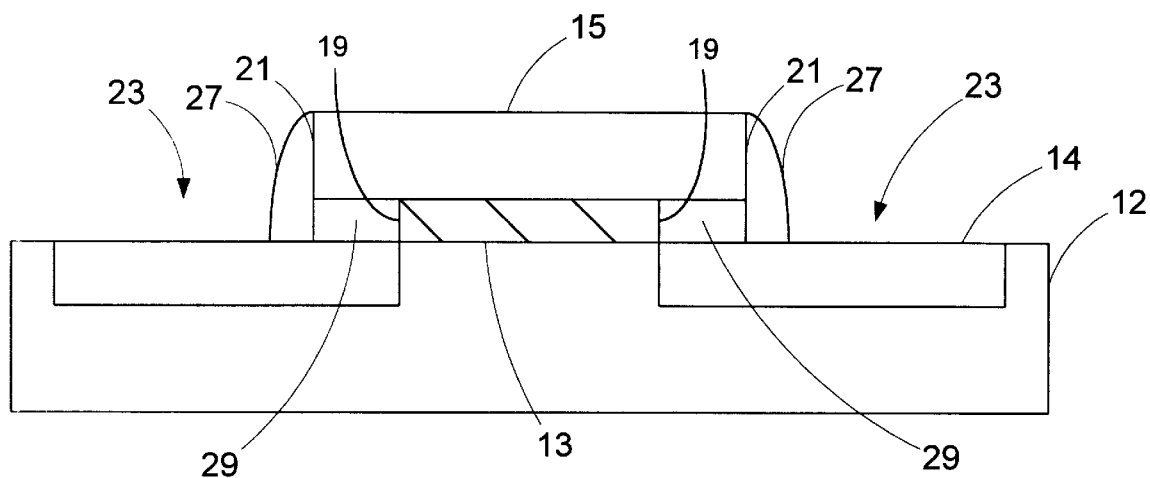
FIG. 3 is a cross-sectional view of the device depicted in FIG. 2 after the device has been subjected to a heat treating process.

As shown in FIG. 3, the next process involves the formation of sidewall spacers 27 adjacent the gate conductor 15. The sidewall spacers 27 may be comprised of a variety of materials, such as silicon dioxide, oxynitride, or silicon nitride, etc. The sidewall spacers 27 may be formed by a conformal deposition of the appropriate material followed by an anisotropic etch of that material using techniques known to those skilled in the art. In one illustrative embodiment, the sidewall spacers 27 are comprised of silicon dioxide having a thickness of approximately 300–800 Å, as measured at the point where the sidewall spacers 27 intersect the surface 14 of the substrate 12. This process results in the formation of an air gap 29 beneath the gate conductor 15, as depicted in FIG. 3. The presence of the air gap 29 decreases the capacitance of the region above the source/drain region 23 between the edge 19 of the gate dielectric 13 and the spacer 27. After the sidewall spacers 27 are formed, as set forth in FIG. 3, further process steps may be taken to complete the formation of the transistors, e.g., the gate conductor 15 may be subject to a salicidation process to improve the conductivity of the gate conductor 15.

Figure 4:
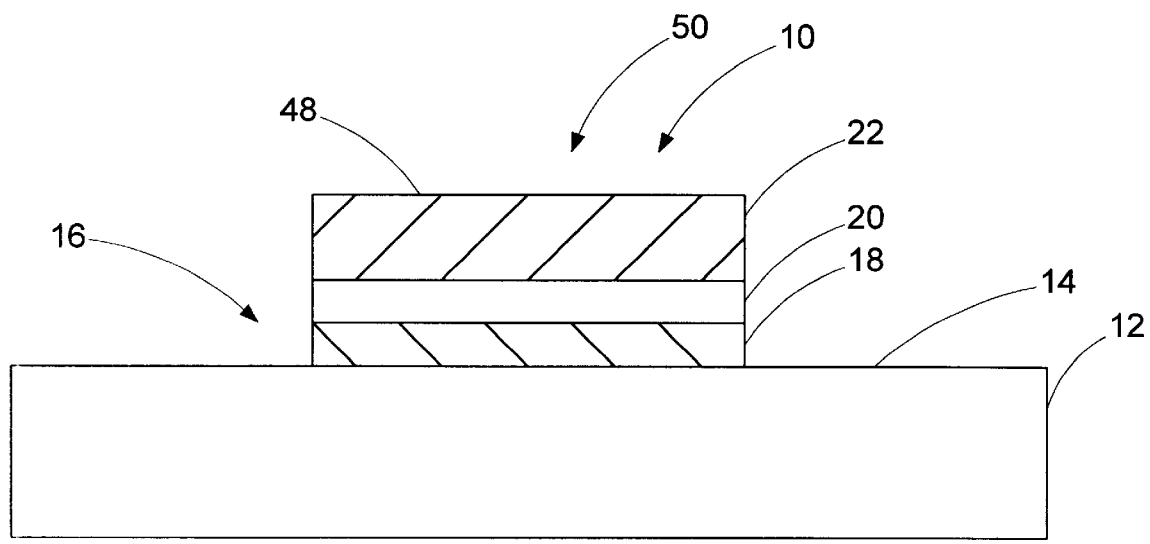
FIG. 4 is a cross-sectional view of a partially-formed semiconductor device having a composite gate dielectric.
Figure 5:
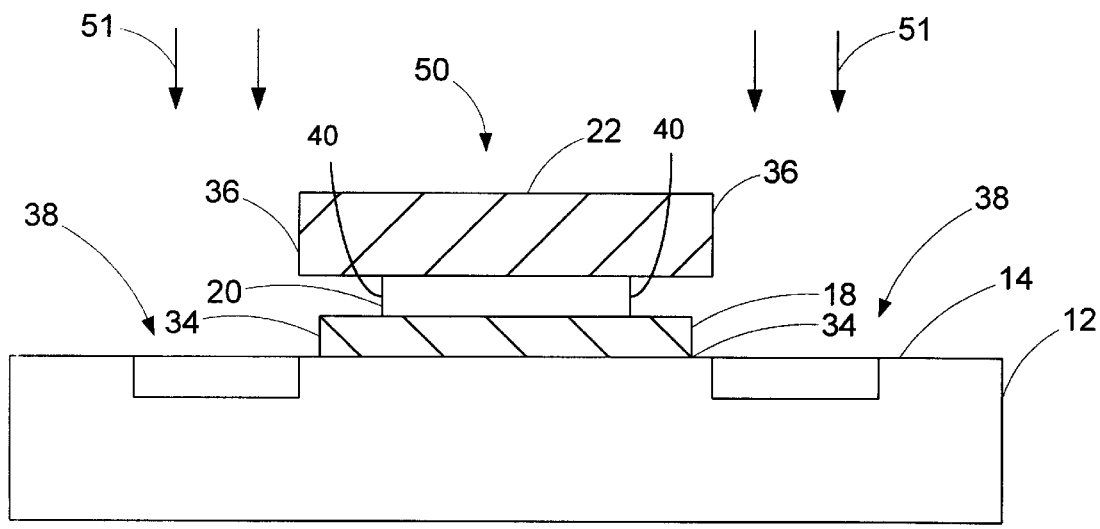
FIG. 5 is a cross-sectional view of the device shown in FIG. 4 after portions of the composite gate dielectric has been removed.
Figure 6:
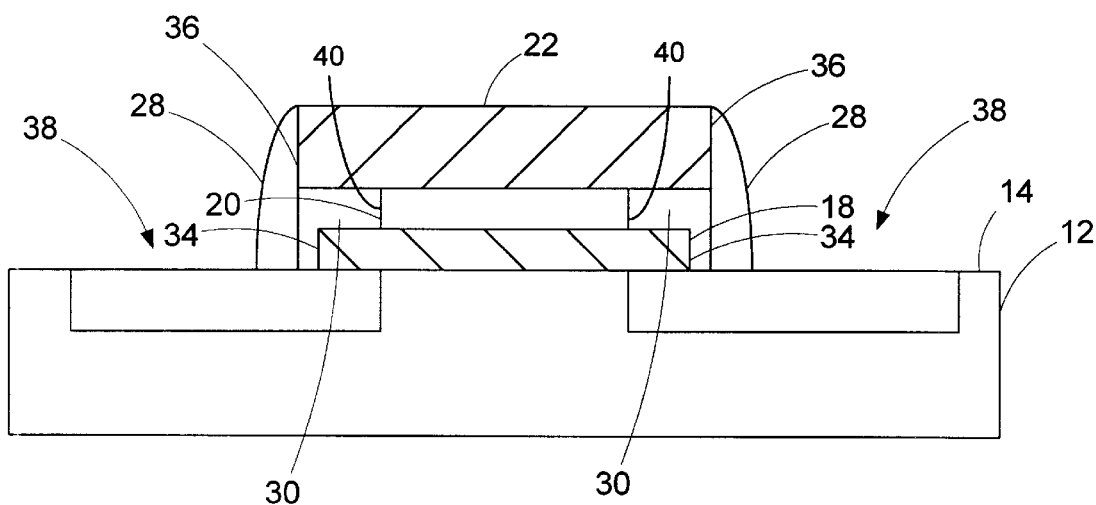
FIG. 6 is a cross-sectional view of the device depicted in FIG. 5 after the device has been subjected to a heat treating process.

An alternative embodiment of the present invention is depicted in FIGS. 4–6. As shown in FIG. 4, a partially-formed transistor 10 is positioned above the surface 14 of a semiconducting substrate 12. The transistor 10 is comprised of a composite gate dielectric 16 and a gate conductor 22. The composite gate dielectric 16 is comprised of at least two process layers, e.g., a first layer 18 and a second layer 20. In general, the first layer 18 is formed above the surface 14 of the substrate 12, the second layer 20 is formed above the first layer 18, and the gate conductor 22 is formed above the second layer 20. Thereafter, the layers 18, 20 and 22 are patterned to result in the stack 50 depicted in FIG. 4. As is readily apparent to those skilled in the art, this patterning may be accomplished by application of, for example, a layer of photoresist (not shown) above the surface 48 of the layer 22, development of the layer of photoresist, and one or more etching steps.

The first layer 18 and the second layer 20 have different etching rates. The difference in the etching rate between the first layer 18 and the second layer 20 may be achieved by at least two different techniques, or combinations thereof. For example, the difference in etching rates between the first layer 18 and the second layer 20 may be due solely to the selection of different materials for these layers. For example, one or of the layers, e.g., layer 18, may be comprised of silicon nitride, while the other layer, e.g., layer 20, may be comprised of silicon dioxide, or vice versa. This difference in etching rates may also be achieved by forming the layers 18, 20 using different techniques, e.g., thermally growing one layer and forming the other layer by a deposition process, e.g., CVD, LPCVD, sputtering etc. Moreover, as a matter of design choice, either of the layers 18, 20 may have the higher etching rate. Using these techniques, one of the layers may have an etch rate that is two to three times faster than that of the other layer.

The first layer 18 may be comprised of a variety of materials, such as silicon dioxide, oxynitride, silicon nitride, or other nitrogen-bearing oxides. The first layer 18 may have a thickness ranging from approximately 20–30 Å. The first process layer 18 may be formed by a variety of known techniques, e.g., deposition, thermal growing, etc. In one illustrative embodiment, the first layer 18 is comprised of thermally grown silicon dioxide having a thickness ranging from approximately 20–30 Å. The first layer 18 comprised of silicon dioxide may be thermally grown at approximately 800–1000° C. in a tube furnace (for 1–5 minutes) or using a rapid thermal anneal process (for 10–60 seconds) in the presence of oxygen. Thereafter, the thermally grown layer of silicon dioxide is subjected to an etching process in a dilute acid concentration to reduce the thickness to approximately 5–15 Å. In one example, this dilute acid etch may be comprised of a 100:1 concentration of hydrochloric acid.

The next process to occur involves the formation of the second layer 20 above the first layer 18. The second layer 20 may be comprised of a variety of materials, such as silicon dioxide, tantalum pentoxide, titanium oxide, or other materials, such as those having a dielectric constant greater than 7. The second layer 20 may be formed by a variety of known techniques, such as chemical vapor deposition (CVD), sputtering, or low pressure chemical vapor deposition (LPCVD). In one illustrative embodiment, the second layer 20 is comprised of a layer of silicon dioxide that is approximately 15–25 Å in thickness that is formed by a CVD process.

The next process involves formation of the gate conductor 22. The gate conductor 22 may be formed of a variety of materials, such as polysilicon or a metal, such as aluminum, tantalum or titanium. Moreover, the gate conductor 22 may be formed by a variety of techniques, such as CVD, LPCVD, etc. In one illustrative embodiment, the gate conductor 22 is formed by chemical vapor deposition of polysilicon having a thickness ranging from approximately 700–2000 Å.

The next process involves subjecting the stack 50 to an etching process. The purpose of this etching process is to reduce the width of at least one of the process layers 18, 20 and perhaps both. This etching process may be either a wet or dry etching process. For example, the stack 50 may be subjected to a 10:1–100:1 hydrochloric acid wet etching process. This wet etching process will result in the stack structure depicted in FIG. 5. Note that, as compared to the first layer 18, more of the second layer 20 is removed during the wet etching process. This occurs due to the difference in etching rates of the first layer 18 as compared to the second layer 20. As is known to those skilled in the art, the second layer 20, formed by deposition process, has an etch rate that is approximately 2–3 times faster than that of the thermally grown first layer 18. Additionally, different compositions of materials may etch at different rates. For example, if the first layer 18 was comprised of silicon nitride, then very little of the first layer 18 would be removed in the wet etching process, and the edges 34 of the first layer 18 would be approximately aligned with the edges 36 of the gate conductor 22. As is readily apparent to those skilled in the art, the materials of construction and/or the method of forming the layers 18, 20 could be designed such that the layer 18 has a faster rate of etching than does layer 20, i.e., after etching, the layer 20 would be wider than layer 18.

The next process involves implantation of a dopant material into the regions 38 of the substrate 12, as depicted in FIG. 5 by the arrows 51. This can be accomplished using the parameters described above with respect to the doping of the regions 23 shown in FIG. 2. The dopant material implanted into the regions 38 is migrated by a heat treating process, such that the regions 38 are approximately aligned with the edges 40 of the second layer 20, as shown in FIG. 5. This migration may be accomplished using the ion implantation techniques and heat treatment processes discussed above with respect to the regions 23.

As shown in FIG. 6, the next process involves the formation of sidewall spacers 28 adjacent the gate conductor 22. The sidewall spacers 28 may be comprised of a variety of materials, such as silicon dioxide, oxynitride, or silicon nitride, etc. The sidewall spacers 28 are formed by a conformal deposition of the appropriate material followed by an anisotropic etch of that material using techniques known to those skilled in the art. In one illustrative embodiment, the sidewall spacers 28 are comprised of silicon dioxide having a thickness of approximately 300–800 Å, as measured at the point where the sidewall spacers 28 intersect the surface 14 of the substrate 12. This process results in the formation of an air gap 30 beneath the gate conductor 22, as depicted in FIG. 6. As stated above, this tends to reduce the capacitance of the structure above a portion of the source/drain region 38. It should be noted that, if the first layer 18 is comprised of a thermally grown layer of silicon nitride, then the edges 34 of the process layer 18 would be approximately aligned with the edges 36 of the gate conductor 22, i.e., there would be little or no gap between the sidewall spacers 28 and the edges 36 of the first layer 18 comprised of silicon nitride. After the sidewall spacers 28 are formed as set forth in FIG. 6, further process steps may be taken to complete the formation of the transistors, e.g., the gate conductor 22 may be subject to a salicidation process to improve the conductivity of the gate conductor 22.

Using the present invention, transistors having a channel length that ranges from approximately 800–1000 Å may be formed. Such a technique allows for improved transistors that operate at greater speeds and with larger drive currents. The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A transistor, comprising:
   a semiconducting substrate, said substrate having a surface;
   a composite gate dielectric positioned above said surface of said substrate, said composite gate dielectric comprised of at least a first layer of material positioned above said surface of said substrate and a second layer of material positioned above said first layer of material, each of said first and second layers of material having a width;
   a gate conductor positioned above one of said first and second layers of said composite gate dielectric, said gate conductor having a width, said width of at least one of said first and second layers of said composite gate dielectric being less than the width of said gate conductor;
   a plurality of sidewall spacers positioned adjacent at least said gate conductor; and
   at least one source/drain region.

2. The transistor of claim 1, further comprising a plurality of air gaps beneath said gate conductor, at least a portion of said air gaps defined by said gate conductor, said plurality of sidewall spacers, and at least one of said first and second layers of material.

3. The transistor of claim 1, wherein said width of said at least one of said first and second layers of material of said composite gate dielectric is approximately 60–80% the width of said gate conductor.

4. The transistor of claim 1, wherein said first and second layers of said composite gate dielectric have etching rates that differ by a factor ranging from approximately 2 to 3.

5. The transistor of claim 1, wherein the width of both said first and second layers of said composite gate dielectric each have a width that is less than said gate conductor.

6. The transistor of claim 1, further comprising a plurality of air gaps beneath said gate conductor, at least a portion of said air gaps defined by said gate conductor, said plurality of sidewall spacers, and said first and second layers of material.

7. The transistor of claim 1, wherein said layer that has a width that is less than said width of said gate conductor is symmetrically positioned under said gate conductor.

8. The transistor of claim 1, wherein said first and second layers each have a width that is less than said width of said conductor, and each of said first and second layers are symmetrically positioned under said gate conductor.

9. The transistor of claim 1, wherein said first and second layers each have a different width, each of which is less than said width of said conductor, and each of said first and second layers are symmetrically positioned under said gate conductor.

10. The transistor of claim 1, wherein said layer that has a width that is less than said width of said gate conductor is symmetrically positioned under said gate conductor, said layer partially defining an air gap beneath said gate conductor on each side of said layer.

11. The transistor of claim 1, wherein said first and second layers each have a width that is less than said width of said conductor, and each of said first and second layers are approximately symmetrically positioned under said gate conductor, said first and second layer partially defining an air gap beneath said gate conductor on each side of said first and second layers.

12. The transistor of claim 1, wherein said first process layer is comprised of at least one of silicon dioxide, silicon nitride, and a nitrogen-bearing oxide.

13. The transistor of claim 1, wherein said second process layer is comprised of at least one of silicon dioxide, tantalum peptoxide, and titanium oxide.

14. The transistor of claim 1, wherein said first process layer is comprised of a thermally grown layer of silicon dioxide and said second process layer is comprised of a deposited layer of silicon dioxide.

15. A transistor, comprising:
    a semiconducting substrate, said substrate having a surface;
    a composite gate dielectric positioned above said surface of said substrate, said composite gate dielectric comprised of at least a first layer of material positioned above said surface of said substrate and a second layer of material positioned above said first layer of material, each of said first and second layers of material having a width;
    a gate conductor positioned above one of said first and second layers of said composite gate dielectric, said gate conductor having a width, said width of said first and second layers of said composite gate dielectric being less than the width of said gate conductor;
    a plurality of sidewall spacers positioned adjacent at least said gate conductor; and
    at least one source/drain region.

16. The transistor of claim 15, further comprising a plurality of air gaps beneath said gate conductor, at least a portion of said air gaps defined by said gate conductor, said plurality of sidewall spacers, and said first and second layers of material.

17. The transistor of claim 15, wherein said width of at least one of said first and second layers of material of said composite gate dielectric is approximately 60–80% the width of said gate conductor.

18. The transistor of claim 15, wherein said first and second layers of said composite gate dielectric have etching rates that differ by a factor ranging from approximately 2 to 3.

19. The transistor of claim 15, wherein the width of said first and second layers are different.

20. The transistor of claim 15, wherein each of said first and second layers are approximately symmetrically positioned under said gate conductor.

21. The transistor of claim 15, wherein each of said first and second layers are approximately symmetrically positioned under said gate conductor, said first and second layers partially defining an air gap beneath said gate conductor on each side of said first and second layers.

22. The transistor of claim 15, wherein said first process layer is comprised of at least one of silicon dioxide, silicon nitride, and a nitrogen-bearing oxide.

23. The transistor of claim 15, wherein said second process layer is comprised of at least one of silicon dioxide, tantalum pentoxide, and titanium oxide.

24. The transistor of claim 15, wherein said first process layer is comprised of a layer of thermally grown silicon dioxide and said second process layer is comprised of a deposited layer of silicon dioxide.

* * * * *